United States Patent [19]

Grabmaier et al.

[11] Patent Number: 4,554,203
[45] Date of Patent: Nov. 19, 1985

[54] METHOD FOR MANUFACTURING LARGE SURFACE SILICON CRYSTAL BODIES FOR SOLAR CELLS, AND BODIES SO PRODUCED

[75] Inventors: Josef Grabmaier, Starnberg; Richard Falckenberg, Wald, both of Fed. Rep. of Germany

[73] Assignee: Siemens Aktiengesellschaft, Berlin & Munich, Fed. Rep. of Germany

[21] Appl. No.: 709,713

[22] Filed: Mar. 8, 1985

[30] Foreign Application Priority Data

Apr. 9, 1984 [DE] Fed. Rep. of Germany ....... 3413369

[51] Int. Cl.⁴ ...................... H01L 21/84; H01L 27/14
[52] U.S. Cl. .................................... 428/229; 136/249; 148/1.5; 148/33; 156/605; 156/607; 156/624; 156/DIG. 64; 156/DIG. 84; 357/4; 357/30; 427/74; 427/86; 427/113; 427/402; 427/434.2; 428/246; 428/408; 428/689; 428/913
[58] Field of Search .................. 148/1.5, 33; 136/249; 156/605, 607, 624, DIG. 64, DIG. 84; 427/74, 86, 113, 402, 434.2; 357/4, 30; 428/229, 246, 689, 913, 408

[56] References Cited

U.S. PATENT DOCUMENTS

| | | | |
|---|---|---|---|
| 3,341,361 | 9/1967 | Gorski | 156/DIG. 88 |
| 4,169,739 | 10/1979 | Lindmayer | 427/431 |
| 4,171,991 | 10/1979 | Lindmayer | 427/431 |
| 4,174,234 | 11/1979 | Lindmayer | 427/431 |
| 4,305,776 | 12/1981 | Grabmaeier | 156/605 |

Primary Examiner—James C. Cannon
Attorney, Agent, or Firm—Hill, Van Santen, Steadman & Simpson

[57] ABSTRACT

An improved large surface, quasi-monocrystalline silicon crystal bodies of the type used in solar cells. The bodies are produced by reacting at least the surface of a carbon fiber fabric with molten silicon under conditions of temperature and viscosity sufficient to cause the molten silicon to penetrate the fabric and produce silicon carbide at at least the surface of the fibers, and immediately thereafter coating the thus reacted fabric with metallic silicon from a second molten silicon bath to produce a silicon coating.

7 Claims, 1 Drawing Figure

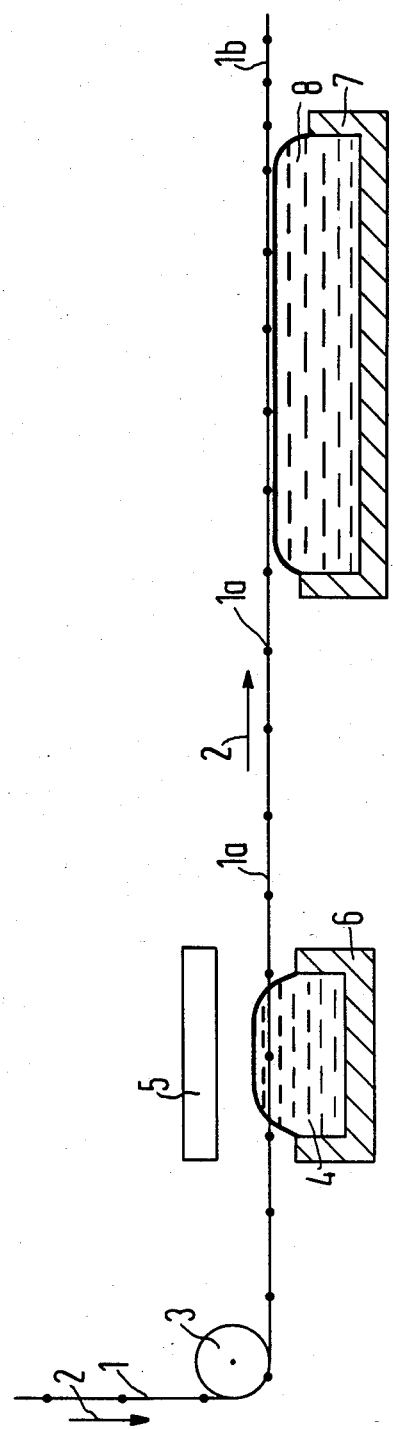

METHOD FOR MANUFACTURING LARGE SURFACE SILICON CRYSTAL BODIES FOR SOLAR CELLS, AND BODIES SO PRODUCED

BACKGROUND OF THE INVENTION

1. Field of the Invention

The present invention is concerned with the manufacture of large surface, quasi-monocrystalline silicon bodies of the type used in solar cells and involves the prevention of carbon penetration from a carbon fabric core into an overlying silicon layer by first providing a silicon carbide surface on the carbon fabric and thereafter applying a substantially pure silicon layer thereover.

2. Description of the Prior Art

In one method of producing large surface, quasi-monocrystalline silicon bodies for solar cells, a reticulate, net-like structure composed of a planar carrier member composed of carbon fibers is brought into contact with molten silicon and the carrier member is integrated into the silicon body by means of crystallization of the silicon. Such a method is disclosed, for example, in DE-OS No. 30 10 557 A1 (corresponding to U.S. Ser. No. 238,943, filed Feb. 27, 1981 and now abandoned). This reference discloses a method for manufacturing planar silicon bodies with a high throughput, on the order of one square meter per minute for solar cells. The coating is controlled relative to the drawing rate such that a thin silicon layer is formed in the meshes of the carrier due to the high surface tension of the molten silicon. Consequently, the network consisting of the fibers is integrated in the silicon body after the body has solidified. During the coating, the carrier member is drawn through a gap-shaped opening in the bottom of a melt crucible. The carrier member, however, can also be drawn tanqentially across the surface of the silicon melt in a suitable tank, such as shown, for example, in DE-OS No. 28 50 805.6 (corresponding to U.S. Ser. No. 092,637, filed Nov. 8, 1979, now U.S. Pat. No. 4,305,776).

While a carbon fiber fabric is very well suited as a carrier for silicon because of its temperature resistance and mechanical flexibility, it has the disadvantage that some carbon is dissolved during the coating with silicon. The saturation solubility of carbon in the silicon melt amounts to about $10^{18}$ At/cm$^3$. As soon as the saturation of the melt with carbon is reached after a brief start-up phase, carbon is introduced into the silicon tape in this concentration. Such an inclusion leads to a reduction in the efficiency of the solar cell fabricated from this material by up to 3%.

SUMMARY OF THE INVENTION

The present invention has for one objective, the avoidance of carbon infiltration from the carbon fiber fabric into the silicon coating. In the method of the type initially described, this object is achieved and the inclusion of carbon into the crystallizing silicon is prevented by first converting the carrier member composed of the carbon fiber fabric into silicon carbide at least at its surface and then immediately thereafter coating the silicon carbide-containing surface with metallic silicon.

If a preformed silicon carbide fiber fabric were used as the carrier member from the beginning, it would have the disadvantages that:

1. It is difficult to produce a silicon carbide fabric due to the brittleness of silicon carbide and 2. Frequent fiber breaks would occur during the tape drawing so that the projecting fiber ends would lead to disruptions in the crystal lattice, particularly at the pn-junctions.

According to the present invention, therefore, at least the surface of the carbon fiber fabric is treated in a first molten silicon bath at temperatures ranging from about 1450° to 1500° C. with the temperature and viscosity of the silicon being sufficient to penetrate the fabric and produce silicon carbide at at least the surface of the fabric and following this, treating the silicon carbide-containing fabric with metallic silicon in a second silicon bath to provide an overlying silicon layer thereon.

The article of the present invention may consist of a core composed of a carbon fiber fabric whose surface includes an integral skin of silicon carbide, the skin being covered by an outer coating of silicon.

BRIEF DESCRIPTION OF THE DRAWINGS

The single FIGURE in the drawing represents schematically a method for the production of the improved article of the present invention.

DESCRIPTION OF THE PREFERRED EMBODIMENTS

In accordance with the method of the present invention, a carrier member 1 composed of a carbon fiber fabric is drawn in the direction of arrow 2 over a roller 3 and then through the surface of a silicon bath 4 which is situated in a melt vat 6 covered by a heater 5. The carrier member 1 by reacting with the molten silicon in the bath 4 is converted at least at its surface into a silicon carbide fiber fabric 1a by such reaction. The silicon bath 4 preceding the actual silicon coating in a melt vat 7 upstream is thereby at a temperature which is preferably about 50° C. above the melting point of silicon, and typically ranges from 1450° to 1500° C. Under these conditions, it is possible to accomplish a complete conversion of the carbon fibers 1 into silicon carbide fibers 1a. A coating of the carrier member 1 with silicon does not occur in this stage because of the low surface tension of the silicon melt 4 at the proposed temperatures. The silicon bath 4 is situated at the same height and directly precedes the coating apparatus consisting of the melt vat 7 containing additional quantities of molten silicon 8 so that a mechanical stressing of the brittle silicon carbide fabric 1a does not occur. The temperature of the molten silicon 8 is below the temperature of the molten bath 4 and may typically lie at the melting point of silicon (about 1420° C.). The vat 7 is heated from below so that the floor region is hotter than the surface region. Normally, a silicon coating of 200 to 300 microns thickness is applied at the molten bath 8.

As shown in the FIGURE, the first treatment of the carbon fiber fabric occurs by-passing the fabric beneath the surface of the molten silicon 4, while the coating is accomplished by running the silicon carbide-containing fabric tangentially to the surface of the molten silicon 8 located in the vat 7.

The time duration for a quantitative conversion of carbon fibers 1 (about 1000 filaments in the form of roving) into silicon carbide fibers 1a at 1450° C. amounts to about 30 seconds. The length of the bath 4 must therefore be adjusted to the drawing rate of the fabric therethrouqh. For example, with a drawing speed of 10 cm/min, a bath length of 0.35 cm is required. With a drawing rate of 2 m/min the length of the bath should be about 7 cm. A shortening of the reaction time by means of further elevating the bath temperature in the molten silicon 4 is not practical because the tensile strength of the silicon carbide fibers 1a is thereby diminished.

The completely coated silicon tape is identified at reference numeral 1b, and is produced after the silicon carbide carrier member 1a is passed along the surface of the silicon melt 8 situated in the melt vat 7. The silicon melt 8 and the silicon bath 4 are continuously replenished with new material by means not shown in the drawing.

One advantage of the method of the present invention lies in the fact that any contaminants can be dissolved out of the carbon fiber fabric 1 in the silicon bath 4 or, respectively, contaminants still remaining in the fabric 1 are "frozen in" the fabric and thus cannot contaminate the silicon coating provided by the melt 8.

It should be evident that various modifications can be made to the described embodiments without departing from the scope of the present invention.

We claim as our invention:

1. A method for the manufacture of large surface, quasi-monocrystalline silicon bodies of the type used in solar cells which comprises:
   reacting at least the surface of a carbon fiber fabric with a first metallic silicon bath under conditions sufficient to form silicon carbide, and immediately thereafter coating the thus reacted fabric with silicon from a second molten silicon bath.

2. A method according to claim 1 wherein said first molten silicon bath is at a temperature of from 1450° to 1500° C.

3. A method according to claim 1 wherein said fabric is drawn through said first molten silicon bath having a temperature of about 1500° C. at a rate of about 10 cm/min, and the length of said bath is about 0.35 cm.

4. A method according to claim 1 wherein said fabric is drawn through said first molten silicon bath at a temperature of about 1500° C. at a rate of about 2 m/min, the length of said bath being about 7 cm.

5. A method for the manufacture of silicon bodies of the type used in solar cells which comprises:
   passing a carbon fiber fabric through a bath of molten silicon having a temperature and viscosity sufficient to penetrate said fabric and produce silicon carbide at least at the surface of the fabric, and
   thereafter treating the silicon carbide containing fabric with metallic silicon at conditions sufficient to provide an overlying silicon layer thereon.

6. A large surface, quasi-monocrystalline silicon body having a core composed of a carbon fiber fabric whose surface includes an integral skin of silicon carbide, said skin being covered by an outer coating of metallic silicon.

7. A silicon body according to claim 6 wherein said core is in the form of a reticulate body.

* * * * *